United States Patent
Chen

(10) Patent No.: US 8,270,166 B2
(45) Date of Patent: Sep. 18, 2012

(54) HEAT DISSIPATION DEVICE FOR ELECTRONIC APPARATUS

(75) Inventor: Rung-An Chen, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 221 days.

(21) Appl. No.: 12/899,738

(22) Filed: Oct. 7, 2010

(65) Prior Publication Data

US 2012/0050983 A1 Mar. 1, 2012

(30) Foreign Application Priority Data

Aug. 24, 2010 (TW) .............................. 99128165 A

(51) Int. Cl.
*H05K 7/20* (2006.01)

(52) U.S. Cl. .............. 361/700; 361/679.47; 361/679.52; 165/104.33

(58) Field of Classification Search .................. None
See application file for complete search history.

(56) References Cited

U.S. PATENT DOCUMENTS

| | | | |
|---|---|---|---|
| 7,675,752 B2 * | 3/2010 | Hongo | 361/700 |
| 7,965,512 B2 * | 6/2011 | Huang et al. | 361/700 |
| 8,023,265 B2 * | 9/2011 | Yang et al. | 361/700 |
| 8,085,542 B2 * | 12/2011 | Yang | 361/719 |
| 8,098,490 B2 * | 1/2012 | Hata | 361/700 |
| 8,107,239 B2 * | 1/2012 | Fujiwara | 361/695 |
| 2003/0081382 A1 * | 5/2003 | Lin | 361/697 |
| 2006/0162901 A1 * | 7/2006 | Aizono et al. | 165/80.4 |
| 2007/0131383 A1 * | 6/2007 | Hattori et al. | 165/11.2 |
| 2008/0093056 A1 * | 4/2008 | Hwang et al. | 165/104.33 |

* cited by examiner

*Primary Examiner* — Boris Chervinsky

(74) *Attorney, Agent, or Firm* — Altis Law Group, Inc.

(57) ABSTRACT

An electronic apparatus includes a circuit board, a first and a second electronic components installed on the circuit board, and a heat dissipation device. The heat dissipation device includes a centrifugal fan defining a first air outlet and a second air outlet, a first fin assembly disposed at the first outlet of the centrifugal fan, a second fin assembly disposed at the second outlet of the centrifugal fan and thermally contacting the second electronic component, and a heat pipe. The heat pipe includes an evaporating section, a first condensing section and a second condensing section located at two ends of the evaporating section. The evaporating section thermally contacts the first electronic component. The first condensing section is thermally attached to the second fin assembly, and the second condensing section is thermally attached to the first fin assembly.

19 Claims, 4 Drawing Sheets

HEAT DISSIPATION DEVICE FOR ELECTRONIC APPARATUS

CROSS-REFERENCE TO RELATED APPLICATIONS

This application claims all benefits accruing under 35 U.S.C. §119 from Taiwan Patent Application No. 99128165, filed on Aug. 24, 2010, in the Taiwan Intellectual Property Office, the contents of which are hereby incorporated by reference.

BACKGROUND

1. Technical Field

The disclosure relates to heat dissipation devices, and particularly to a heat dissipation device for use in an electronic apparatus.

2. Description of Related Art

Nowadays, with the development of electronics technology, an electronic apparatus such as a computer or a server is much thinner and smaller than before. Yet the electronic apparatus is able to hold many more electronic components than before. However, the electronic components generate a large amount of heat during operation. The interior space of the electronic apparatus is very limited, and the electronic components occupy much of that space, which results in heat generated by the electronic components accumulating rather than being dissipated in timely manner.

What is needed, therefore, is a heat dissipation device for an electronic apparatus which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
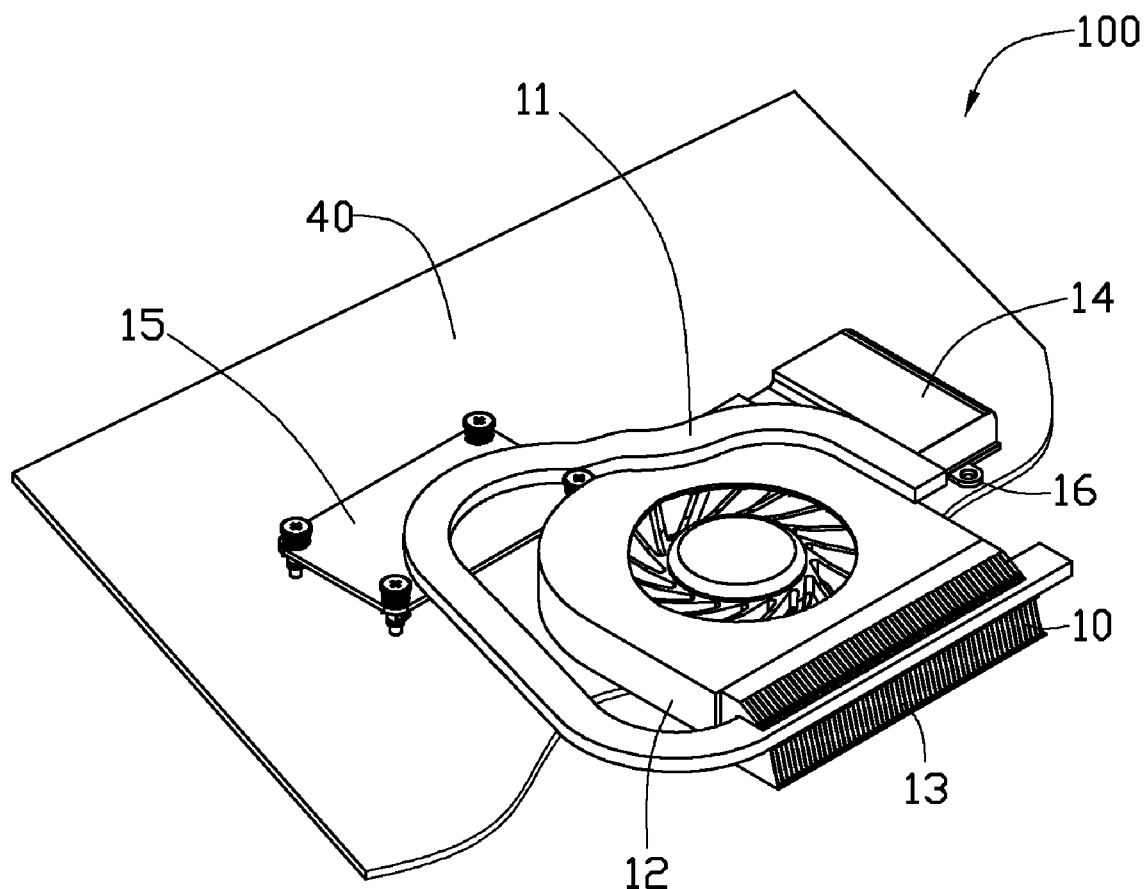
FIG. 1 is an isometric, assembled view of an electronic apparatus in accordance with an embodiment of the disclosure.
Figure 2:
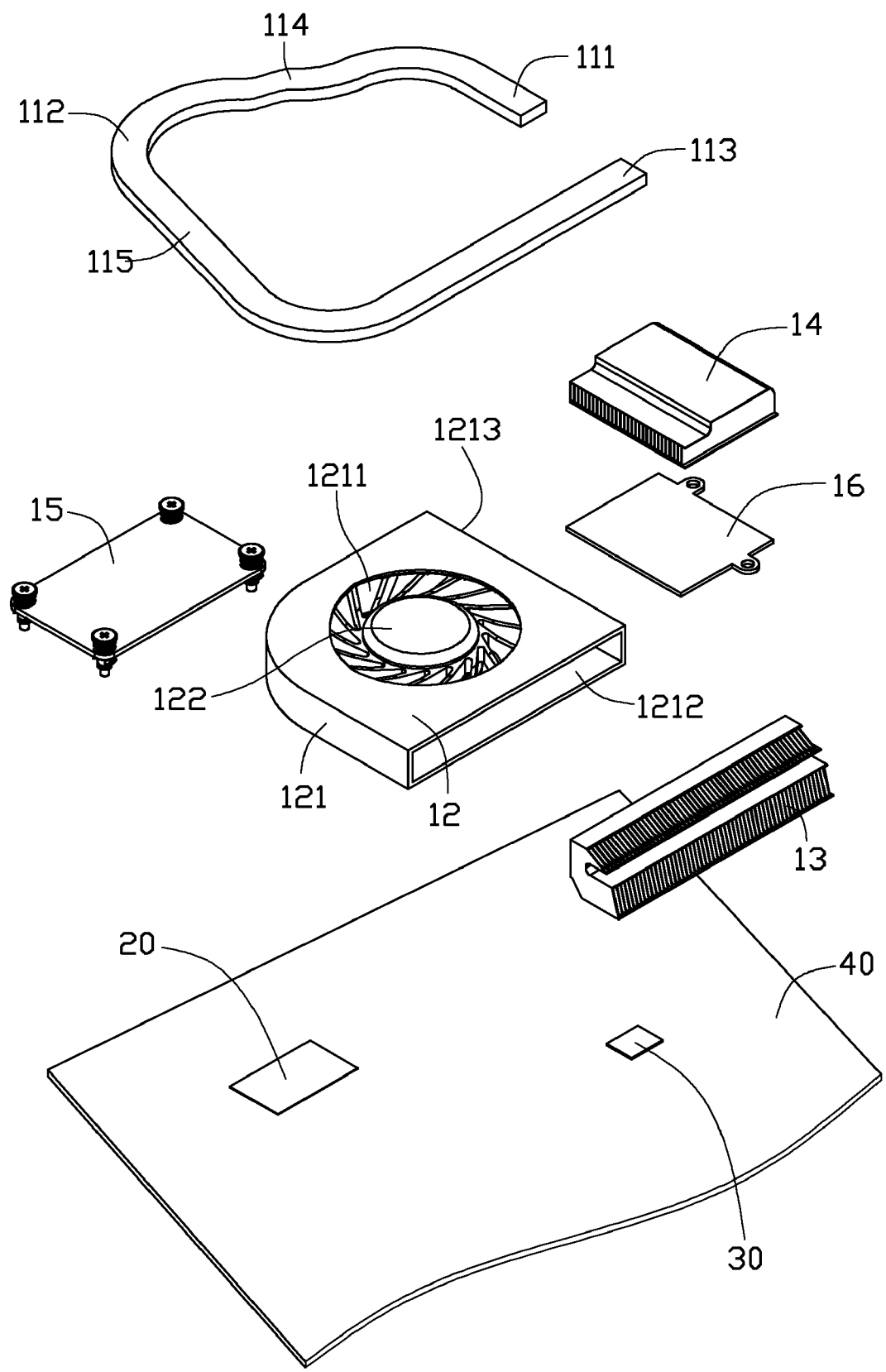
FIG. 2 is an exploded view of the electronic apparatus of FIG. 1.

Referring to FIGS. 1 and 2, an electronic apparatus 100 in accordance with an embodiment of the present disclosure is shown. The electronic apparatus 100 includes a heat dissipation device 10, a first electronic component, a second electronic component, and a printed circuit board (PCB) 40. In this embodiment, the first electronic component is a central processing unit (CPU) 20, the second electronic component is a chip 30. The CPU 20 and the chip 30 are mounted on the PCB 40. The power of the CPU 20 is greater than that of the chip 30, so that the CPU 20 generates more heat than the chip 30. The heat dissipation device 10 is used for cooling the CPU 20 and the chip 30 simultaneously.

The heat dissipation device 10 includes a centrifugal fan 12, a heat pipe 11 surrounding the centrifugal fan 12, first and second fin assemblies 13, 14 thermally connected to two ends of the heat pipe 11, a first heat spreader 15 thermally contacting the CPU 20, and a second heat spreader 16 thermally contacting the chip 30.

The heat pipe 11 can be flat, and includes first and second condensing sections 111, 113 at the two ends thereof, an evaporating section 112 located at a middle thereof, a first connecting section 114 located between the first condensing section 111 and the evaporating section 112, and a second connecting section 115 located between the second condensing section 113 and the evaporating section 112. The second condensing section 113 is longer than the first condensing section 111. The second condensing section 113 is thermally attached to the first fin assembly 13, and the first condensing section 111 is thermally attached to the second fin assembly 14.

The centrifugal fan 12 includes a hollow fan frame 121, and an impeller 122 mounted in the fan frame 121. An air inlet 1211 is defined in a center of a top face of the fan frame 121. A first air outlet 1212 and a second air outlet 1213 are respectively defined in two adjacent lateral sides of the fan frame 121. The first air outlet 1212 is perpendicular to the air inlet 1211 and the second air outlet 1213. A transverse cross-sectional area of the first air outlet 1212 is greater than that of the second air outlet 1213.

The first fin assembly 13 and the second fin assembly 14 are made of different thermally conductive materials. The thermal conductivity of the first fin assembly 13 is greater than that of the second fin assembly 14. In this embodiment, the first fin assembly 13 is made of copper, and the second fin assembly 14 is made of aluminum. A surface area of the first fin assembly 13 is greater than that of the second fin assembly 14.

Figure 3:
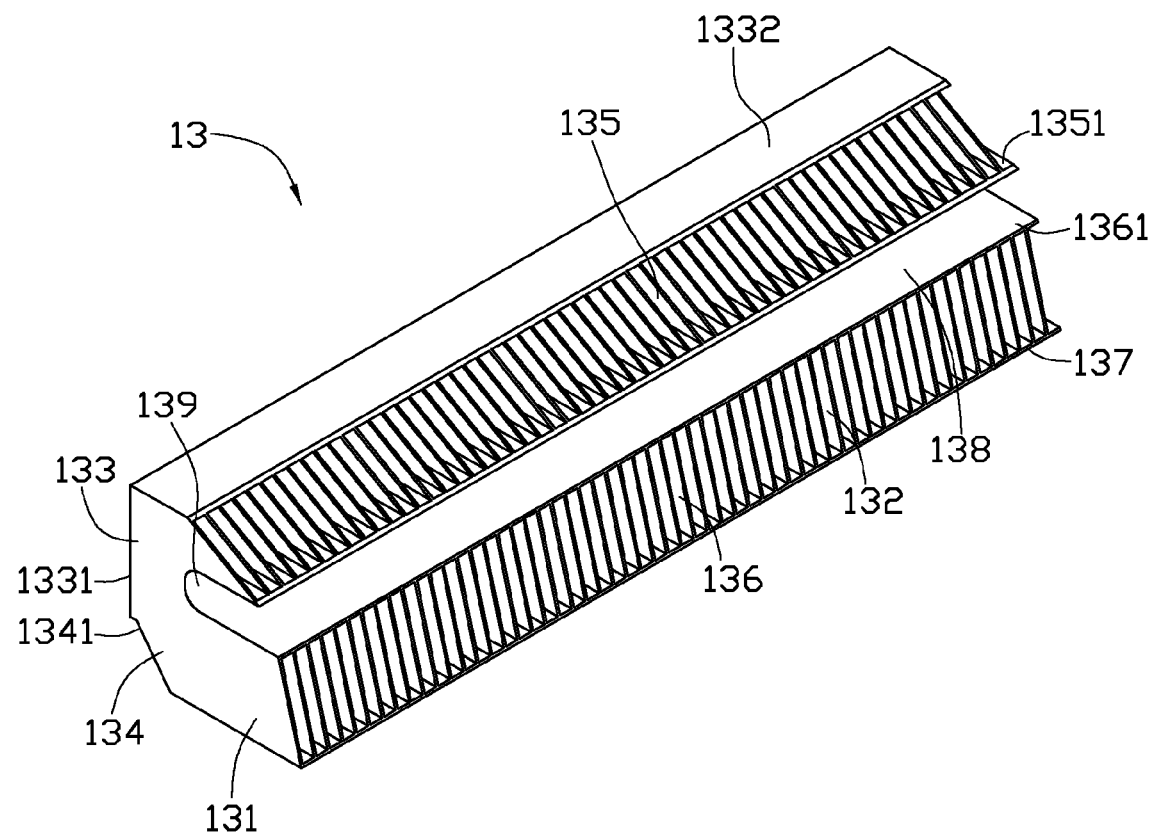
FIG. 3 is an enlarged view of a first fin assembly of the electronic apparatus of FIG. 2.

The first fin assembly 13 includes a plurality of spaced, substantially parallel, first fins 131. A plurality of first airflow channels 132 are formed between adjacent first fins 131. Also referring to FIG. 3, the first fin assembly 13 is divided into four portions, i.e. an air inlet portion 133 located at the first air outlet 1212 of the centrifugal fan 12, an airflow guiding portion 134 extending slantwise downwardly from the air inlet portion 133, to the first and second air outlet portions 135, 136 located opposite to the air inlet portion 133.

A top of the air inlet portion 133 is sealed by an elongated first top plate 1332. An air inlet 1331 is formed at a lateral side of the air inlet portion 133 between the first top plate 1332 and the airflow guiding portion 134. The air inlet 1331 abuts against the first air outlet 1212 of the centrifugal fan 12. An outer face of the airflow guiding portion 134 is sealed by an elongated, slantwise airflow guiding plate 1341. The airflow guiding plate 1341 can guide a part of airflow flowing through the air inlet portion 133 towards the second air outlet portion 136. A bottom of the first air outlet portion 135 is sealed by an elongated first bottom plate 1351, and a top of the first air outlet portion 135, which is not sealed, forms a slantwise air outlet face. An angle between the air outlet face of the first air outlet portion 135 and the first top plate 1332 can be an acute angle. The second air outlet portion 136 is spaced from the first air outlet portion 135. A bottom of the second air outlet portion 136 is sealed by an elongated second bottom plate 137. The second bottom plate 137 connects the airflow guiding plate 1341 of the airflow guiding portion 134. A top of the second air outlet portion 136 is sealed by an elongated second top plate 1361. The first top plate 1332, the second top plate 1361, the first bottom plate 1351, and the second bottom plate 137 are substantially parallel to each other. The first bottom plate 1351 and the second top plate 1361 are connected by a curved connecting plate 139, so that the first bottom plate 1351, the second top plate 1361, and the connecting plate 139 cooperatively form an elongated groove 138. The second condensing section 113 of the heat pipe 11 is received in the groove 138.

Figure 4:
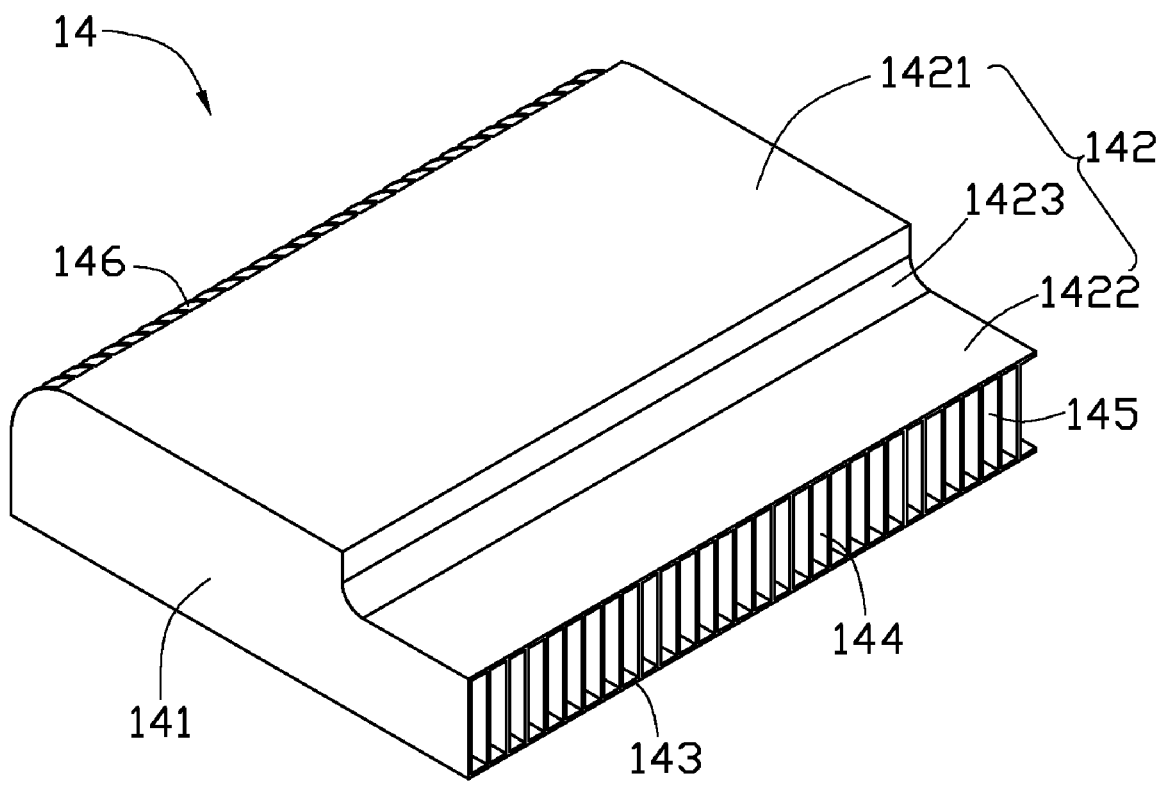
FIG. 4 is an enlarged view of a second fin assembly of the electronic apparatus of FIG. 2.

Also referring to FIG. 4, the second fin assembly 14 includes a plurality of spaced, substantially parallel, second fins 141, a top plate 142 and a bottom plate 143 respectively connected to top and bottom of the second fins 141. Each of the second fins 141 can be substantially L-shaped. The top plate 142 includes a rectangular first flat plate 1421, a bending plate 1423 extending vertically downwardly from the first flat plate 1421, and a rectangular second flat plate 1422 extending outwardly and horizontally from the bending plate 1423. The first flat plate 1421 is substantially parallel to the second flat plate 1422. The first condensing section 111 of the heat pipe 11 is thermally attached to the second flat plate 1422 of the top plate 142. A plurality of second airflow channels 144 are formed between adjacent second fins 141, the top plate 142, and the bottom plate 143. An opening of the second airflow channels 144 near the second flat plate 1422 is used as an air inlet 145 of the second fin assembly 14. Another opposite opening of the second airflow channels 144 near the first flat plate 1421 is used as an air outlet 146 of the second fin assembly 14. The air inlet 145 of the second fin assembly 14 abuts against the second air outlet 1213 of the centrifugal fan 12.

Each of the first heat spreader 15 and the second heat spreader 16 is made of metal such as aluminum, copper, or an alloy thereof. A bottom face of the first heat spreader 15 thermally contacts the CPU 20, and a bottom face of the evaporating section 112 of the heat pipe 11 thermally contacts a top face of the first heat spreader 15. A bottom face of the second heat spreader 16 thermally contacts the chip 30, and a top face of the second heat spreader 16 thermally contacts a bottom face of the bottom plate 143 of the second fin assembly 14.

During operation of the electronic apparatus 100, the first heat spreader 15 absorbs heat generated from the CPU 20. The heat pipe 14 then absorbs heat in the first heat spreader 15 and transfers it to the first fin assembly 13 and the second fin assembly 14 simultaneously. The second heat spreader 16 absorbs heat generated from the chip 30 and transfers it to the second fin assembly 14. The centrifugal fan 12 draws air through the air inlet 1211 into the fan frame 121. The air under the action of the impeller 122 is blown from the first air outlet 1212 and the second air outlet 1213 towards the first fin assembly 13 and the second fin assembly 14, respectively. In the present electronic apparatus 100, the first and second fin assemblies 13, 14 are both used to dissipate heat from the CPU 20 which generates more heat than the chip 30. Also, the first fin assembly 13 is designed to have a thermal conductivity greater than that of the second fin assembly 14 in response to the hotter CPU 20. The second fin assembly 14 is used to dissipate heat for the chip 30 only which generates less heat than the CPU 20. Thus, the heat dissipation device 10 can be used to dissipate heat simultaneously from the CPU 20 and the chip 30, and the heat removing capability between the CPU 20 and the chip 30 is balanced.

It is believed that the embodiments and their advantages will be understood from the foregoing description, and it will be apparent that various changes may be made thereto without departing from the spirit and scope of the disclosure or sacrificing all of its material advantages, the examples hereinbefore described merely being embodiments of the disclosure.

What is claimed is:

1. A heat dissipation device for cooling a first electronic component and a second electronic component simultaneously wherein the first electronic component generates more heat than the second electronic component during operation, the heat dissipation device comprising:
   a centrifugal fan defining a first air outlet and a second air outlet in lateral sides thereof;
   a first fin assembly disposed at the first outlet of the centrifugal fan;
   a second fin assembly disposed at the second outlet of the centrifugal fan and thermally contacting the second electronic component, the first fin assembly and the second fin assembly being made of different thermally conductive materials, and the thermal conductivity of the first fin assembly being greater than that of the second fin assembly; and
   a heat pipe comprising an evaporating section at a middle thereof, and a first condensing section and a second condensing section located at two opposite ends of the evaporating section, the evaporating section thermally contacting the first electronic component, the first condensing section being thermally attached to the second fin assembly, and the second condensing section being thermally attached to the first fin assembly.

2. The heat dissipation device of claim 1, wherein the first fin assembly is made of copper and the second fin assembly is made of aluminum.

3. The heat dissipation device of claim 2, wherein a surface area of the first fin assembly is greater than that of the second fin assembly.

4. The heat dissipation device of claim 3, wherein the second condensing section is longer than the first condensing section.

5. The heat dissipation device of claim 2, wherein the first fin assembly comprises an air inlet portion abutting the first air outlet of the centrifugal fan, a first air outlet portion and a second air outlet portion spaced from each other and located opposite to the air inlet portion, and an airflow guiding portion extending slantwise downwardly from the air inlet portion to the first air outlet portion and the second air outlet portion.

6. The heat dissipation device of claim 5, wherein an elongated groove is formed between the first air outlet portion and the second air outlet portion, and the second condensing section of the heat pipe is received in the groove.

7. The heat dissipation device of claim 6, wherein the airflow guiding portion comprises a slantwise airflow guiding plate located between the air inlet portion and the second air outlet portion.

8. The heat dissipation device of claim 2, wherein the second fin assembly comprises a plurality of spaced fins, and a top plate and a bottom plate respectively connected to a top and a bottom of the second fins, the top plate comprising a first flat plate, a bending plate extending vertically downwardly from the first flat plate, and a second flat plate extending outwardly and horizontally from the bending plate, wherein the first condensing section of the heat pipe is thermally attached to the second flat plate of the top plate.

9. The heat dissipation device of claim 8, further comprising a first heat spreader and a second heat spreader, wherein a bottom face of the first heat spreader thermally contacts the first electronic component, a bottom face of the evaporating section of the heat pipe thermally contacts a top face of the first heat spreader, a bottom face of the second heat spreader thermally contacts the second electronic component, and a top face of the second heat spreader thermally contacts the bottom plate of the second fin assembly.

10. An electronic apparatus comprising:
a circuit board;
a first electronic component installed on the circuit board;
a second electronic component installed on the circuit board, the first electronic component generating more heat than the second electronic component during operation; and
a heat dissipation device cooling the first electronic component and the second electronic component simultaneously, the heat dissipation device comprising:
a centrifugal fan defining a first air outlet and a second air outlet in lateral sides thereof;
a first fin assembly disposed at the first outlet of the centrifugal fan;
a second fin assembly disposed at the second outlet of the centrifugal fan and thermally contacting the second electronic component, the first fin assembly and the second fin assembly being made of different thermally conductive materials, and the thermal conductivity of the first fin assembly being greater than that of the second fin assembly; and
a heat pipe comprising an evaporating section at a middle thereof, and a first condensing section and a second condensing section located at two opposite ends of the evaporating section, the evaporating section thermally contacting the first electronic component, the first condensing section being thermally attached to the second fin assembly, and the second condensing section being thermally attached to the first fin assembly.

11. The electronic apparatus of claim 10, wherein the first electronic component is a central processing unit, and the second electronic component is a chip.

12. The electronic apparatus of claim 11, wherein the first fin assembly is made of copper and the second fin assembly is made of aluminum.

13. The electronic apparatus of claim 12, wherein a surface area of the first fin assembly is greater than that of the second fin assembly.

14. The electronic apparatus of claim 13, wherein the second condensing section is longer than the first condensing section.

15. The electronic apparatus of claim 12, wherein the first fin assembly comprises an air inlet portion abutting the first air outlet of the centrifugal fan, a first air outlet portion and a second air outlet portion spaced from each other and located opposite to the air inlet portion, and an airflow guiding portion extending slantwise downwardly from the air inlet portion to the first air outlet portion and the second air outlet portion.

16. The electronic apparatus of claim 15, wherein an elongated groove is formed between the first air outlet portion and the second air outlet portion, and the second condensing section of the heat pipe is received in the groove.

17. The electronic apparatus of claim 16, wherein the airflow guiding portion comprises a slantwise airflow guiding plate located between the air inlet portion and the second air outlet portion.

18. The electronic apparatus of claim 12, wherein the second fin assembly comprises a plurality of spaced fins, and a top plate and a bottom plate respectively connected to a top and a bottom of the second fins, the top plate comprising a first flat plate, a bending plate extending vertically downwardly from the first flat plate, and a second flat plate extending outwardly and horizontally from the bending plate, wherein the first condensing section of the heat pipe is thermally attached to the second flat plate of the top plate.

19. The electronic apparatus of claim 18, wherein the heat dissipation device further comprises a first heat spreader and a second heat spreader, wherein a bottom face of the first heat spreader thermally contacts the first electronic component, a bottom face of the evaporating section of the heat pipe thermally contacts a top face of the first heat spreader, a bottom face of the second heat spreader thermally contacts the second electronic component, and a top face of the second heat spreader thermally contacts the bottom plate of the second fin assembly.

\* \* \* \* \*